US010126476B2

(12) United States Patent
Odes (10) Patent No.: US 10,126,476 B2
(45) Date of Patent: Nov. 13, 2018

(54) POLARIZATION ROTATOR

(71) Applicant: ELTA SYSTEMS LTD., Ashdod (IL)

(72) Inventor: Uriel Odes, Givaat Shmuel (IL)

(73) Assignee: ELTA SYSTEMS LTD., Ashdod (IL)

( * ) Notice: Subject to any disclaimer, the term of this patent is extended or adjusted under 35 U.S.C. 154(b) by 454 days.

(21) Appl. No.: 14/719,101

(22) Filed: May 21, 2015

(65) Prior Publication Data

US 2015/0349431 A1 Dec. 3, 2015

(30) Foreign Application Priority Data

May 29, 2014 (IL) .......................... 232866

(51) Int. Cl.
| | | |
|---|---|---|
| *H01Q 19/00* | (2006.01) | |
| *G02B 5/30* | (2006.01) | |
| *G06F 17/10* | (2006.01) | |
| *G06F 17/50* | (2006.01) | |
| *G02B 27/28* | (2006.01) | |
| *H01Q 15/00* | (2006.01) | |

(Continued)

(52) U.S. Cl.
CPC ......... *G02B 5/3058* (2013.01); *G02B 27/286* (2013.01); *G06F 17/10* (2013.01); *G06F 17/5009* (2013.01); *H01Q 15/0026* (2013.01); *H01Q 15/246* (2013.01); *G02B 27/0012* (2013.01)

(58) Field of Classification Search
CPC .. H01Q 15/246; H01Q 15/0026; H01Q 19/00; G06F 17/10
USPC ....................................................... 343/756
See application file for complete search history.

(56) References Cited

U.S. PATENT DOCUMENTS 2,554,936 A 5/1951 Burtner
6,788,461 B2 9/2004 Kurtz et al.
(Continued)

FOREIGN PATENT DOCUMENTS

EP 0795928 9/1997

OTHER PUBLICATIONS

Amidror et al., "Analysis of the microstructures ("rosettes") in the superposition of periodic layers", Journal of Electronic Imaging 11(3), 316-337 (Jul. 2002).

(Continued)

*Primary Examiner* — Huedung Mancuso
(74) *Attorney, Agent, or Firm* — Dorsey & Whitney LLP (57) ABSTRACT

A polarization rotator including a plurality of polarizer layers that are stacked along a general direction of radiation propagation. Each polarizer layers implements a wired grid pattern associated with respective extinction axis for extinction of radiation components that are polarized therealong. The extinction axes of consecutive polarizer layers are orientated differently so that polarization of radiation interacting therewith is rotated. The relative orientations of the polarizer layers are selected such that a tiling of a plurality of substantially identical polarization rotation unit cells is defined within the polarization rotator, where the unit cells are arranged with predetermined spatial periods A and B along two lateral axes. The polarization rotator may be coupled to an array of elements (e.g. antennas) arranged parallel to the tiling of unit cells, with respective spatial periodicities A' and B' that are integer multiples of the predetermined spatial periods A and B of the unit cells.

14 Claims, 6 Drawing Sheets

(51) Int. Cl.
*H01Q 15/24* (2006.01)
*G02B 27/00* (2006.01)

(56) References Cited

U.S. PATENT DOCUMENTS

| | | | | |
|---|---|---|---|---|
| 7,561,332 B2* | 7/2009 | Little | ................ | B82Y 30/00 349/1 |
| 7,813,039 B2* | 10/2010 | Perkins | ................ | G02B 5/3058 359/485.05 |
| 7,961,393 B2* | 6/2011 | Perkins | ................ | G02B 5/3058 359/485.05 |
| 8,611,007 B2* | 12/2013 | Davis | ................ | B82Y 20/00 359/485.05 |
| 8,913,320 B2* | 12/2014 | Davis | ................ | G02B 5/3058 359/485.05 |
| 2006/0119937 A1 | 6/2006 | Perkins et al. | | |

OTHER PUBLICATIONS

European Search Report from European Application No. 15168594.8-1562 dated Oct. 28, 2015.
Lech et al., "Analysis and Design of a Polarizer Rotator System", IEEE Transactions on Antennas and Propagation, vol. 56. No. 3. Mar. 2008, pp. 844-847.
Torres et al., "Analysis and Design of a Two-Octave Polarization Rotator for Microwave Frequency", IEEE Transactions on Antennas and Propagation, vol. 41, No. 2, Feb. 1, 1993, pp. 208-213.

* cited by examiner

Fig. 1

(General Art)

POLARIZATION ROTATOR

TECHNOLOGICAL FIELD

Embodiments of the present invention relate to the field of polarization filters and, more particularly, relate to polarization rotation modules for use in arrays of electro-magnetic radiation receiving or transmitting elements.

BACKGROUND

Antenna arrays, and in general, arrays of modules for receiving and/or transmitting electro-magnetic radiation (hereinafter transceiver modules), are widely used for various applications. Such arrays may provide high reception/or transmission gains as well as the ability to control the directions of the transmission or reception beams. The transceiver modules of an antenna array are, in many cases, arranged in a lattice defining tiling of reception and transmission modules that are typically similar to one another.

In some cases, polarization filters, such as a polarizer or polarization rotator, are arranged in front of the antenna array. Typically, the polarization filter is configured to extend laterally over several or all of the transceiver modules so as to cover the fields of view of several of them.

Such a polarization filter may be configured for example utilizing several wire-grid layers each including an arrangement of parallel conductive lines (e.g. wires and/or printed conductive lines). The conductive lines are arranged parallel to one another along a direction defining polarization extinction axis of the corresponding layer of the polarization filter. To this end, radiation components which are polarized parallel to the extinction axis of the layer, are reflected back or suppressed when interacting with the layer, and are therefore substantially prevented from being transmitted through the layer.

Examples of such wire-grid polarization filters are described for example in U.S. Pat. No. 6,788,461 and U.S. patent application publication No. 2006/0119937. Acknowledgement of these references herein is not to be inferred as meaning that these are in any way relevant to the patentability of the presently disclosed subject matter.

GENERAL DESCRIPTION

A highly desirable trait when designing an array of receiving and/or transmitting modules (transceiver modules such as antenna elements), is that the transceiver elements operate under similar intrinsic system conditions, and function in a similar way. For example, in some cases it may be desired that all the elements function in the same way, or that the elements are grouped into one or more groups of elements operating under similar intrinsic conditions.

However, in some cases even when the similar or identical transceiver elements are used/deployed in an antenna array or other array of transceiver elements, there may still be some intrinsic conditions, which may have different effects on certain elements, thus yielding somewhat different functional operations of the transceivers in the array. Such differences in intrinsic conditions may inter-alia result from a difference in the configuration/structure of a filter positioned in the "fields of view" of each of the transceiver elements.

The present invention provides a polarization filter for placement in front of an array of transceiver elements/antennas. The polarization filter is configured in accordance with the arrangement of the elements/antennas in the array so as to have a substantially similar effect on all of the elements, or to have a substantially similar effect on a certain group(s) of elements in the array. To this end, the polarization filter configuration of the present invention reduces or eliminates any difference between the intrinsic conditions to which different elements of the array are exposed. Particularly, the present invention provides a polarization filter system, and a method for applying polarization filtration to radiation propagating to, or from, an array of transceiver elements, while having a substantially similar effect on all of the transceiver elements, thereby reducing any differentiation between the intrinsic conditions to which the different transceiver elements are exposed.

In this connection it should be noted that the term transceiver elements/modules is used herein to designate modules/elements that are capable of transmitting and/or receiving electro-magnetic (EM) radiation. In particular, in the following, antenna elements/modules are considered, arranged to form an antenna array. To this end, for clarity, the terms antenna elements and/or antenna modules are used interchangeably to designate transceiver elements in general, and the phrase antenna array is used to designate an array of receiving and/or transmitting modules. However it should be understood that the terms antenna-module/element and antenna-array are used herein to designate in general any kind of modules capable of transmitting and/or receiving electro-magnetic radiation such as light source modules (e.g. lasers or light emitting diodes (LEDS)), optical detectors or emitters and others.

It should also be noted here that the term internal/intrinsic conditions is used herein to designate conditions that affect operation of the transceiver modules (of the antenna elements) and which are related to configuration of the system in which the antenna elements reside. This is as opposed to extrinsic conditions relating to the nature of the radiation propagating to/from the antenna elements and/or to the surroundings, external to the system, through which the radiation propagates.

Figure 1:
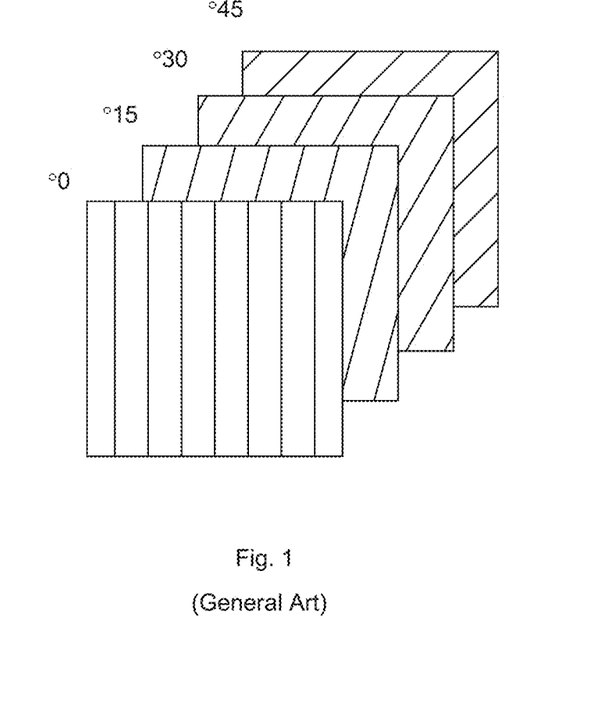
FIG. 1 is a schematic illustration of a conventional configuration of an antenna array module including a polarization rotator.

A conventional configuration of a transmitting and/or receiving array (antenna array) including an array TR of antenna elements $E_{i,j}$ and a polarization filter PR is illustrated in FIG. 1. The conventional polarization filters PR used with such arrays are, in many cases, a source variable intrinsic conditions, which have different effect on different antenna elements $E_{i,j}$ of the array TR. For example, a polarization filter configured for rotating the polarization of the radiation passing therethrough by a certain polarization rotation angle α (e.g. 45°) may include a stack of wire-grid polarizers (here four polarizers L1 to L4) arranged with different relative orientations so as to apply polarization rotation to radiation passing through the stack. Typically, the polarizers are implemented by patterned elements, such as conductive wire grid structures, with a certain spatial periodicity of the pattern. Accordingly, as the different polarizers are stacked with different relative orientations with respect to one another, the entire polarization filter PR of the conventional technique may have no spatial periodicity, (or it may be periodic only at very large length scales (e.g. in the order of, or larger than the entire antenna array). For example, orientation angles $\alpha_1$ to $\alpha_K$ of the polarizers in such filters are in many cases selected so as to equally divide the polarization rotation angle α (e.g. $\alpha_k=(k-1)*\alpha/(K-1)$ where $\alpha_1=0°$, K is the number of polarizers and k is the polarize index in the stack). Thus, in a four layer (K=4) polarization filter for rotating the polarization by a total polarization rotation angle α=45°, the orientation angles of the polarizer layers might be conventionally selected as follows: 0°, 15°, 30°, and 45°.

However, a major deficiency in conventional techniques for designing such polarization rotation filters/modules is that conventional polarization filters PR, including more than two polarizers (i.e. for which K>2), may have no spatial periodicity of relatively long length scale (larger than the periodicity of the antenna elements' array) which is meant to be placed behind of the polarization rotation filter PR. This may result in each of the transceiver/antenna elements $E_{i,j}$ "seeing" a different configuration/pattern of the polarization filter PR in its field of view. As a result, the polarization rotation filter PR may have a different effect on different antenna elements $E_{i,j}$, which either deteriorates the performance of such system as a whole, or is required to be taken into account during the design stage of such a system. In the latter case, specific computations and/or simulations are typically required for each of the antenna elements (e.g. during the system design/calibration stage(s)) to estimate their operation, while including the different intrinsic effects that such a polarization rotation filter has on the different elements. However, this may be highly computationally intensive, and may result in less than optimal operation of the antenna system, and, additionally, might require extensive time and computational resources at the stages of system design and/or at later stages (e.g. at a system calibration stage).

The present invention provides for solving such problems which exist in conventional techniques. According to some aspects of the present invention, the polarizer is configured in accordance with the arrangement of the array of transmitting/receiving elements that is to be located behind it, such that one or more pluralities/groups of transmitting/receiving elements are exposed to substantially similar patterns of the polarization rotator in their fields of view. This simplifies the design of the system and/or its calibration, since each group of transmitting/receiving elements, together with their respective part of the polarizer, being in their field of view, are similar to one another in configuration and in operation.

According to a broad aspect of the present invention, provided is a polarization rotator (polarization rotation filter) including a plurality of polarizer layers stacked along a general direction of radiation propagation therethrough. Each of the polarizer layers implements a respective wired grid pattern which defines a respective extinction axis, such that extinct components of the radiation are polarized along that respective extinction axis when radiation interacts with the respective polarizer layer. Also, each pair of consecutive polarizer layers of the polarization rotator are arranged such that their respective extinction axes have different orientations, thereby affecting polarization rotation of the radiation interacting with the polarization rotator. According to some aspects of the present invention the wire-grid patterns of the polarizer layers are configured as continuous patterns defining relative orientations of the extinction axes such as to define, in the polarization rotator, a tiling of a plurality of substantially identical polarization rotation unit cells, which are arranged with predetermined respective spatial periods A and B along two lateral axes spanning the tiling.

According to another broad aspect of the present invention there is provided a radiation module (e.g. antenna module) including an array of elements (i.e. receiving, transmitting, or transceiving elements; e.g. antenna elements), and a polarization rotator which is configured according to the present invention and defines a tiling of a plurality of substantially identical polarization rotation unit cells. The elements are arranged in a plane substantially parallel to the tiling of the plurality of the polarization rotation unit cells. More specifically, the elements are arranged with respective spatial periodicities A' and B' along each of the two lateral axes spanning the tiling, where the respective spatial periodicities A' and B' are, respectively, integer multiples of the predetermined spatial periods A and B of the polarization rotation unit cells. Accordingly, the antenna elements are exposed to substantially similar wire-grid patterns of the polarization rotator's layers in their respective fields of view.

According to some embodiments of the present invention the lateral extent of the polarization rotator is configured to be greater than a lateral extent of the arrangement of elements/antennas along the two lateral axes spanning the tiling such that the field of view of each of the elements is entirely covered by the polarization rotator. Also, in some embodiments, each of the elements/antenna-elements is associated with one or more of the polarization rotator unit cells covering its field of view.

According to some embodiments of the present invention the polarization rotator includes a number of N polarization rotation layers. The layers are arranged in a stack and configured for rotating the polarization of the radiation by a predetermined angle α. In some embodiments the number of polarization rotation layers N is selected in accordance with a desired width Δλ of the operational wavelength band of the polarization rotator such that for wider bands a greater number of layers N is used. Also, in some embodiments a ratio between the predetermined spatial periods, A and B, of the tiling of the substantially identical polarization rotation unit cells along said two lateral axes respectively is given by A/B=tan(α)/(N−1). The polarizer layers in the stack may be configured according to the invention such that the extinction axes thereof are oriented with orientation angles $\alpha_k = \tan^{-1}((k-1)A/B)$ where k indicates the location of the polarizer layer in the stack.

According to some embodiments of the present invention the polarizer layers of the polarization rotator include continuous wire-grid patterns which are formed with corresponding respective pitches $d_k$ selected such that the continuous wire-grid patterns are periodic along a certain lateral axis with spatial periodicity N*d, where N is an integer number and d is a predetermined value associated with a nominal pitch distance. To this end the predetermined respective spatial period A of the unit cells along the certain lateral axis may be given by A=N*d. Also the respective pitches $d_k$ of the continuous wire-grid patterns of polarizer layers may be selected to satisfy $d_k = d*N_k*\cos(\alpha_k)$, where $N_k$ is an integer or a rational number associated with each polarizer layer k respectively, and $\alpha_k$ is the orientation of the respective polarizer layer k. In some specific cases the respective pitches $d_k$ of the continuous wire-grid patterns of polarizer layers satisfy $d_k = d*\cos(\alpha_k)$.

According to some embodiments of the present invention the continuous wire-grid pattern of each polarizer layer is formed as an arrangement of a plurality of continuous conductive line regions spaced apart from one another and oriented along the extinction axis of the polarizer layer. For example the continuous conductive line regions of the wire-grid pattern may be spaced from one another at a distance of less than a nominal wavelength λ of the radiation which is to be polarized. In some implementations at least some of said polarizer layers include a dielectric substrate with the plurality of continuous conductive line regions printed thereon. Also, in such implementations, one or more spacer layers may be arranged in between at least two of the polarizer layers. For example the dielectric substrate may include at least one of a ceramic and glass-reinforced epoxy laminate material, and the spacer layer may include structural foam. In some implementations the conductive line regions of at least one polarizer layer may be formed utilizing conductive wires arranged in the layer.

According to another broad aspect of the present invention there is provided an antenna including an array of antenna elements and a polarization rotator. The antenna elements of the array are arranged with spatial periodicities, A' and B', with respect to two lateral axes of the antenna. The polarization rotator includes a stack of a plurality of K polarizer layers which are stacked along a general direction of radiation propagation to or from the antenna elements. The plurality of K polarizer layers respectively implement continuous wired grid patterns oriented so as to rotate the polarization of the radiation. According to some aspects of the present invention each polarizer layer, indexed k in the stack, is oriented with orientation angle $\alpha_k = \tan^{-1}((k-1)(n*A')/(m*B))$, where k is an index of a corresponding polarizer layer k in the stack of K layers and n and m are predetermined integers.

According to some embodiments of the present invention the antenna is configured/implemented utilizing as an integrated structure which includes at a stack printed circuit boards. The stack of printed circuit boards includes least one printed circuit layer with the antenna array printed thereon, and one or more printed circuit board with one or more of the polarizer layers printed thereon. In some embodiments the antenna elements of the array are arranged with spatial periodicity A' along a certain axis, and the polarization rotator is configured to rotate the polarization of the radiation by an angle $\alpha$. Accordingly the spatial periodicity B' with respect to the other lateral axes of the antenna is selected such that $B'=(n*A')/(m*\tan(\alpha))$.

To this end, the array of antenna elements may be implemented as a one dimensional array. Alternatively, the array of antenna elements may be implemented as a two dimensional array of antenna elements.

In some embodiments of the present invention the antenna elements may be arranged in a rectangular lattice with spatial periodicities A' and B' along the two respective axes spanning the lattice. This feature may be used to provide that the antenna elements are exposed to substantially similar wire-grid patterns of the polarization rotator's layers in their respective fields of view.

In some embodiments of the present invention the antenna elements may be arranged in a Triangular or an Hexagonal lattice with spatial periodicities A' and B' along two axes spanning the lattice respectively. The antenna elements may thereby be associated with two or more groups of antenna elements, wherein the antenna elements of each group are exposed to substantially similar wire-grid patterns of the polarization rotator's layers in their fields of view.

According to some embodiments of the present invention the continuous wire-grid patterns of the polarizer layers of the antenna are formed with corresponding respective pitches $d_k$ satisfying $d_k=d*N_k*\cos(\alpha_k)$, where d is a predetermined value, $N_k$ is an integer or a rational number associated with each polarizer layer k respectively, and $\alpha_k$ is the orientation of the respective polarizer layer k. This provides that the continuous wire-grid patterns of the polarization layers have a common spatial periodicity along a certain lateral axis of the antenna.

According to yet another broad aspect of the present invention there is provided a method for use in applying polarization rotation to radiation. The method includes providing data indicative of a total polarization rotation angle $\alpha$ to be applied to radiation interacting with a polarization filter module comprising a stack including a number K of polarizer layers, and setting an orientation angle $\alpha_k$ of each polarizer layer k of said K polarizer layers as $\alpha_k=\tan^{-1}(\tan(\alpha)(k-1)/(K-1))$. Here k is the index of said polarizer layer in the stack of K polarizer layers. According to some embodiments of the present invention, the method further includes providing a desired ratio A/B between spatial periodicities A and B to be obtained in the polarization filter module with respect to two lateral axes thereof respectively. Then, determining the number K of polarizer layers base on that ratio as follows: $K=1+(B/A)*\tan(\alpha)$.

According to some embodiments of the present invention one or more of the polarizer layers are implemented as/utilizing respective wire-grid patterns. Accordingly, the method of the present invention may further include selecting the pitches $d_k$ of the respective wire-grid pattern of the one or more polarizer layers based on the respective index k and the orientation angle $\alpha_k$ of each of these one or more polarization layers as follows: $d_k=d*N_k*\cos(\alpha_k)$. Here d is a predetermined value, $N_k$ is an integer or a rational number associated with each of the polarizer layers. In some cases $N_k$ may be selected to be 1 for some or all of these one or more layers and thus $d_k=d*\cos(\alpha_k)$.

Various features and advantages of the present invention are described in more detail in the description section below. It should be understood, and will be apparent to a person of ordinary skill in the art, that various modifications and implementations which are not specifically described herein, may be applied to the technique of the present invention without departing from the scope of the appended claims.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which.

DETAILED DESCRIPTION OF EMBODIMENTS

Figure 2A:
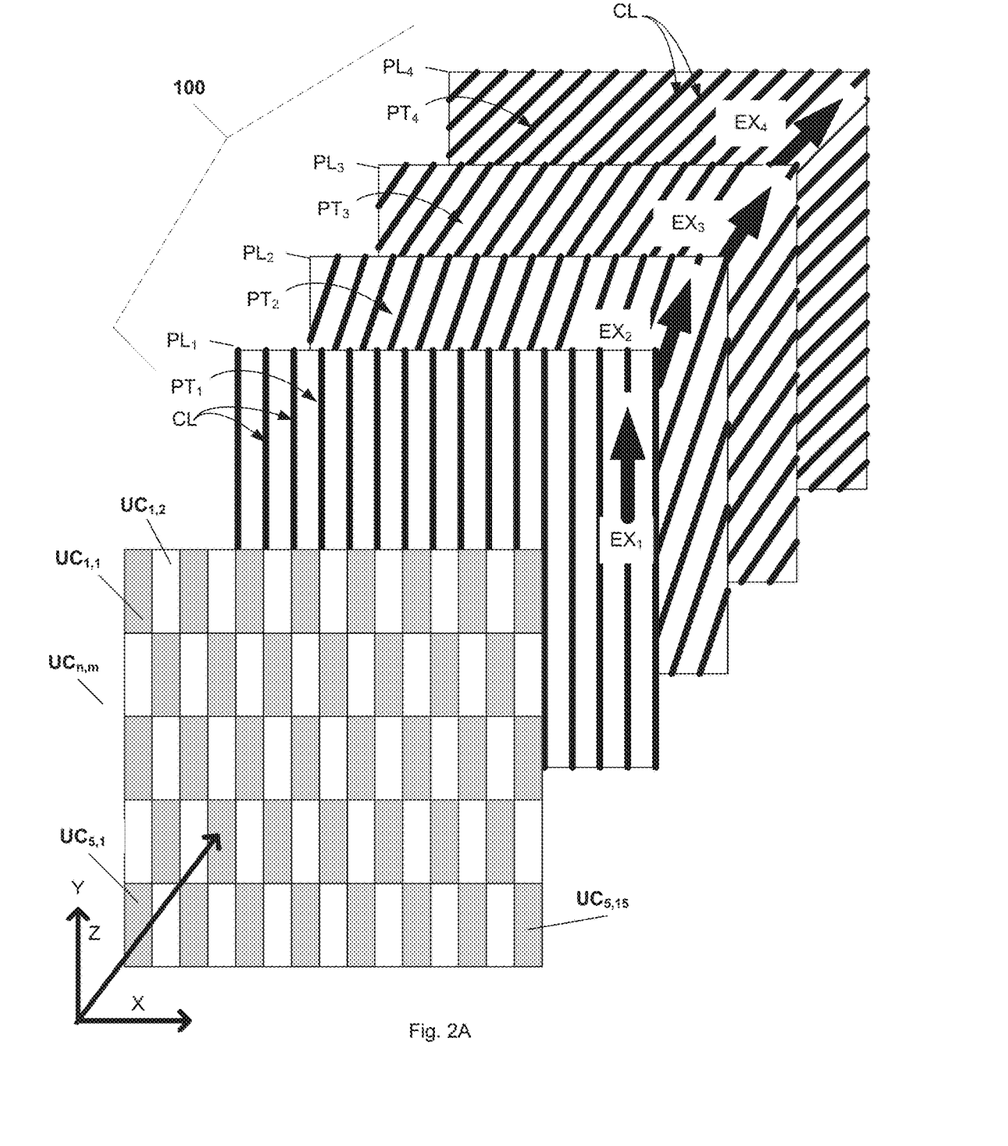
FIGS. 2A to 2E schematically illustrate a polarization rotator module 100 configured according to an embodiment of the present invention.
Figure 2B:
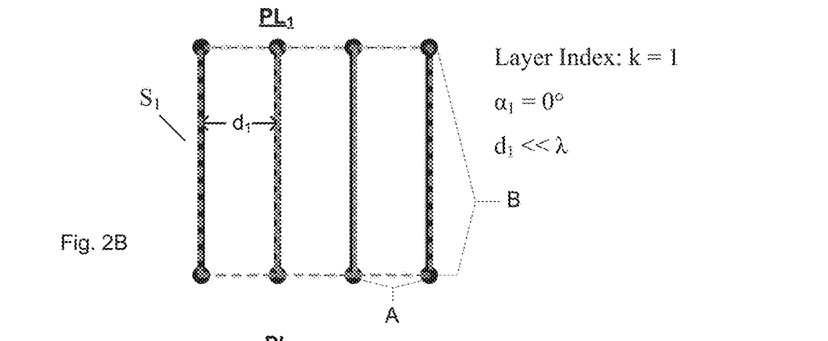
Figure 2C:
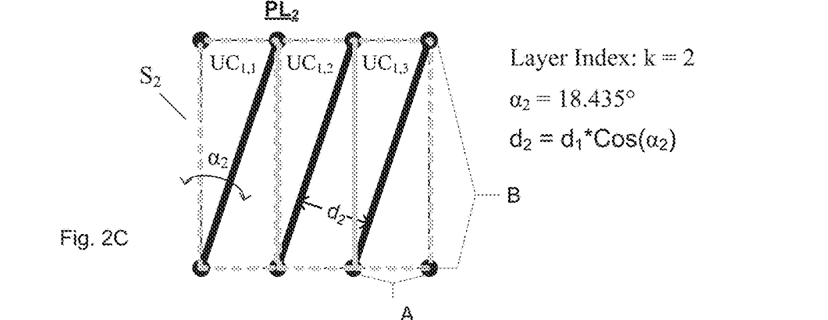
Figure 2D:
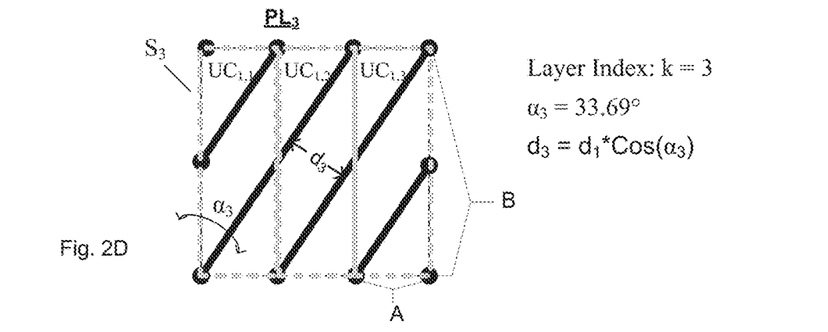
Figure 2E:
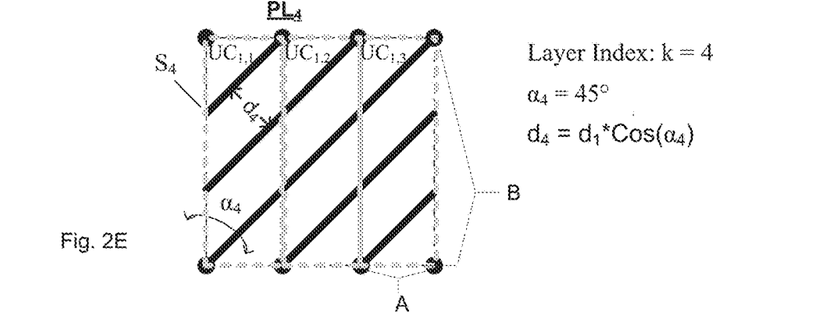

Reference is now made to FIG. 2A schematically illustrating the configuration of a polarization rotator module 100 (e.g. filter) according to an embodiment of the present invention. As illustrated the polarization rotator 100 includes a plurality of K polarizer layers $PL_1$ to $PL_K$ stacked one on top of the other (e.g. stacked along a general direction Z of radiation propagation through the polarization rotator module 100). In the following, a capital K is used to denote the total number of polarizer layers in the polarization rotator module 100, and k indicates the order index of each layer in the stack ($1 \leq k \leq K$). Each layer $PL_k$ of the polarizer layers PL$_1$ to PL$_K$ is configured as a polarization filter associated with a certain respective extinction axis EX$_k$ and is adapted to filter (e.g. extinct/reflect back) radiation components which are polarized along the extinction axis EX$_k$ when interacting with/incident on the layer PL$_k$. The polarizer layers PL$_k$ implement respective patterns PT$_k$ defining the directions/orientations α$_k$ of their respective extinction axes EX$_k$. Accordingly, the layers PL$_1$ to PL$_K$, e.g. their respective patterns PT$_k$ and the orientations α$_k$ thereof, are configured to affect polarization rotation to radiation successively interacting therewith. To this end, respective extinction axes EX$_k$ of different polarizer layers PL$_k$ are differently oriented, so as to rotate the polarization of radiation interacting with the polarization rotator module 100.

According to some embodiments of the present invention, the patterns PT$_k$ implemented by the respective polarizer layers PL$_k$ are configured as continuous patterns. The patterns PT$_k$ of the polarizer layers PL$_k$ are arranged such that the extinction axes EX$_1$-EX$_K$ of the layers are oriented with orientation angles α$_1$ to α$_K$, that are specifically selected such that a plurality of substantially identical polarization rotation unit cells UC$_{n,m}$ are defined by the polarization rotator module 100. More particularly, as illustrated in the FIG. 2A, the polarization rotator module 100 of this example can be sectioned into 25 polarization rotation unit cells UC$_{1,1}$ to UC$_{5,15}$ having similar configurations and arranged in a two dimensional tiling (e.g. defining a lattice of unit cells UC$_{n,m}$ of similar configurations and electrical/optical properties). In this connection, it should be understood that although in this and the following examples, a two dimensional arrangement/tiling of such polarization rotation unit cells is described, a person of ordinary skill in the art will readily appreciate that the same technique can also be used to configure the polarization rotation module 100 to define a one dimensional tiling of similar unit cells.

As indicated above and will be further exemplified in more detail below, the configuration of the polarization rotator module 100 of the invention, defining the plurality of similar unit cells, allows to place the polarization rotator module 100 in front of an array (1D or 2D array) of radiation transmitting and/or receiving elements (e.g. antenna elements) such that the transceiving elements are exposed to substantially similar patterns of the polarization rotator's layers in their respective fields of view. Accordingly, the polarization rotator module has the same effect on all the transceiving elements. This may obviate a need to separately design and/or calibrate the reception/transmission operation of each of the transceiving elements in accordance with the particular configuration (e.g. layer patterns) of the section of the polarization rotator module which is located in front of it in its field of view.

As indicated above, according to certain embodiments of the present invention, the angles α$_1$ to α$_K$ of the respective patterns PT$_k$ of the polarizer layers PL$_k$ (e.g. the orientations of their respective extinction axes EX$_k$) are specifically selected in accordance with the desired dimensions/special periodicities A and B of the desired unit cells UC$_{n,m}$ to be defined in the polarization rotator 100. Here A and B designate the dimensions/periodicities of the unit cells along the two lateral axes X and Y of the polarization rotator 100 respectively. As will be described in more detail below, the dimensions/special periodicities A and B of the desired unit cells are generally associated with the spatial periodicities of the antenna elements array to be located behind the polarization rotator 100. More particularly, according to some embodiments of the present invention the respective orientations α$_k$ of the patterns PT$_k$ and/or that of the extinction axes defined thereby EX$_k$ are selected in accordance with the following formula:

$$\alpha_k = \tan^{-1}((k-1)A/B) \quad \text{Eq. (1)}$$

where k indicates the index of the location of the polarizer layer PL$_k$ in the stack of polarizer layers in the polarization rotator 100 and A and B are the spatial periodicities/dimensions of the polarization rotation unit cells UC$_{n,m}$ along the lateral axes X and Y respectively. Note that α$_1$=0°, which is the orientation angle of the pattern PT$_1$ (or of the extinction axis EX$_1$ thereof) of the first layer PL$_1$ is used here as a reference, relative to which the angles α$_k$ of the patterns of all of the other polarization layers PL$_k$ are measured.

It should also be noted that the terms spatial periodicities and dimensions (i.e. A and B) of the unit cells UC$_{n,m}$ are used here interchangeably. The angles α$_k$ are in fact determined based on the desired spatial periodicities A and B of the unit cells tiling along the lateral directions X and Y respectively. However, as the unit cells are considered to be tightly packed, A and B also designate the lateral dimensions thereof.

As illustrated in the figure, according to some embodiments of the invention, the patterns PT$_k$ of the polarization layers PL$_k$ may be implemented as wire grid patterns, each formed as an arrangement CL$_k$ of a plurality of substantially parallel and continuous conductive line regions, which are spaced apart from one another and oriented along the respective extinction axis EX$_k$ of its corresponding polarizer layer PL$_k$. Accordingly, radiation components polarized along the conductive lines CL$_k$ induce electric current in the conductive lines and are thus substantially reflected/absorbed thereby when interacting with the polarizer layer PL$_k$, while other polarization components (e.g. polarized perpendicularly to the conductive lines) are substantially not absorbed/reflected but mostly substantially pass the polarizer layer PL$_k$ un-affected.

In this connection, the d$_k$ pitch distance of conductive lines CL$_k$ of the respective wire grid patterns PT$_k$ is typically selected to be smaller than the nominal wavelength λ$_n$ of the wavelength band of the radiation that is to be affected (its polarization rotated) by the polarization rotator module 100. In other words the conductive lines CL$_k$ of the wire grid patterns PT$_k$ are typically spaced apart from one another with distances d$_k$ substantially smaller than the nominal wavelength λ$_n$ (d$_k$<<λ$_n$) in order to provide efficient extinction (e.g. reflection) of radiation components polarized along the conductive lines CL$_k$.

According to some embodiments of the present invention, the number K of polarization rotation layers PL$_k$ may be selected in accordance with the width Δλ of the wavelength band of the radiation considered and total angle α by which the polarization of the radiation is to be rotated by the polarization rotator 100. For example, for larger polarization rotation angles α and/or for broader band widths Δλ, a greater number K of polarizer layers PL$_k$ may generally be used. Thus, proper selection of the number K of polarizer layers provides that polarization of radiation with wavelengths λ being in the bandwidth λ$_n$−Δλ<λ<λ$_n$+Δλ can be effectively rotated by the polarization rotator 100. The separation/spacing S between consecutive polarizer layers (i.e. along the axis Z perpendicular thereto) is typically selected in the order of S~λ$_n$/4. This provides for efficient polarization rotation operation of the polarization rotator module 100 to radiation of wavelengths λ.

Referring together to FIGS. 2B to 2E, illustrated are sections S$_1$ to S4 which are corresponding sections of polarization layers $PL_1$ to $PL_4$ of a polarization rotator module 100 that is configured similarly to the polarization rotator module exemplified in FIG. 2A. In this non limiting example, the polarization rotator module 100 includes a total of K=4 polarization layers $PL_1$ to $PL_4$. Sections $S_1$ to $S4$, which are respective parts of the polarization layers $PL_1$ to $PL_4$, encompass three polarization rotation unit cells $UC_{1,1}$ $UC_{1,2}$ $UC_{1,3}$, having dimensions A and B along the two lateral axes X and Y respectively. The polarization rotator module 100 is configured to filter one of the polarization components of radiation interacting therewith (e.g. filter the component that is parallel to the extinction axis of the first polarizer layer it interacts with (e.g. filter the polarization component parallel to $EX_4$) and also to rotate the polarization of the second polarization component of that radiation (e.g. rotate the polarization component orthogonal to $EX_4$) by a total polarization rotation to angle α (e.g. so it becomes orthogonal to the extinction axis $EX_1$ of the last polarizer layer with which the radiation interacts on the way to the antenna array).

The lateral dimensions A and B of the smallest possible unit cell UC can be determined based on the following equation:

$$A/B = \text{Tan}(\alpha)/(K-1) \quad \text{Eq. (2)}$$

The unit cell UC represents the smallest repeatable "building block" sections/structures defined in the polarization rotation module 100. The polarization rotator 100 may be regarded as a tightly packed tiling of a plurality of similar such unit cells UC seamlessly "stitched" together.

In the present example of FIGS. 2B to 2E, the total polarization rotation angle α was selected to be α=45° and the number K of polarizer layers is 4. Accordingly the ratio of the unit cell's lateral dimensions A and B, satisfy $A/B = \text{Tan}(\alpha)/(K-1) = \frac{1}{3}$. Given a desired one of such lateral dimensions/periodicities of the unit cells (A or B), the other one of them can thus be determined. To this end the desired lateral dimension (A or B) may be determined based on a periodicity of the antenna/transceiver array which is to be located in front of the polarization rotator.

As can be seen in FIGS. 2B to 2E, in each layer $PL_k$ of the polarizer layers $PL_1$ to $PL_4$ of the polarization rotation module, unit cell sections can be stitched together to form a continuous wire-grid pattern in the layer, without any discontinuity of the pattern (e.g. of the conductive lines in the pattern) in the border line between adjacent unit cell sections. Accordingly, an array of antenna elements (or, more generally, array radiation receiving and/or transmitting modules) may be arranged in front of the polarization rotation module 100 with spatial periodicities A'=n*A' and B'=m*B between the antenna elements in the array, to thereby provide that the antenna elements are exposed in their respective fields of view to the similar structures/patterns of the polarization rotation module's layers.

This is achieved according to the invention by properly selecting the orientation angles $\alpha_k$ of the wire-grid patterns $PT_k$ of the respective layers $PL_k$ (indexed k). More specifically, according to some embodiments of the present invention the orientation angles are selected in accordance with the desired lateral dimensions of the unit cells (the ratio between them) as in Eq. 1 above. Alternatively or additionally, as the ratio A/B may depend on the number of polarizer layers K and the total angle of polarization rotation α, the orientation angles $\alpha_k$ may be computed based on these parameters as follows:

$$\alpha_k = \text{Tan}^{-1}(\text{Tan}(\alpha)(k-1)/(K-1)). \quad \text{Eq. (3)}$$

It should be noted that the total number of polarizer layers K may be selected based on Eq. (2) above in accordance with the desired ratio A/B of the lateral periodicities/lateral dimensions of the unit cells and the total polarization rotation angle α. In such a case, the orientation angles $\alpha_k$ may be selected in accordance with Eq. (1) above, based on the desired ratio A/B of the lateral periodicities/lateral dimensions of the unit cells.

Alternatively or additionally, the number K of polarizer layers may be predetermined in advance. For example, K may be a given design parameter, which may be selected to approximate the ratio A/B while also to optimize operation of the polarization rotation in the desired bandwidth Δλ considering that for wider desired bandwidth Δλ a higher number K of polarizer layers should preferably be used. Accordingly, in case K is a given parameter, the orientation angles $\alpha_k$ may be selected in accordance with Eq. (3) above, based on K and on the total polarization rotation angle α.

To this end, according to some embodiments of the present invention the spacing $d_k$ between the conductive lines/wires (the pitches of the conductive lines $d_k$ in each of the patterns $PT_k$) are also specifically selected to provide that the wire grid patterns $PT_k$, in each of the layers k respectively, are formed as continuous wire-grid patterns across the entire polarization rotation module 100. To this end, the unit cells of the polarization rotator 100 module are similar in their configuration (and layer pattern structures) and also no discontinuities are formed in the border between unit cells. In some embodiments, this may be achieved by selecting the pitches $d_k$ conductive lines at each layer polarizer layer $PL_k$ respectively as follows:

$$d_k = d * \text{Cos}(\alpha_k) \quad \text{Eq. (4)}$$

Where d is a certain predetermined nominal pitch distance of the conductive line and $\alpha_k$ is the orientation angle of the wire-grid polarizer pattern in the respective layer indexed k. Typically, d is selected to be smaller than the nominal wavelength λ of the radiation whose polarization is to be rotated. In this connection, it should also be noted that in the present example d=$d_1$ actually defines the spatial period A of the unit cells (d=A).

More generally, it should be understood that the pitch distances $d_k$ are selected such that the respective wire-grid patterns $PT_k$ are all periodic along a certain lateral axis (e.g. X) with spatial periodicity N*d (where N is a certain integer number). To this end, the predetermined spatial period A of the unit cells may be given by A=N*d. Thus, in the general case, this condition may be satisfied by selecting pitches $d_k$ of conductive lines at each respective polarizer layer $PL_k$ as follows:

$$d_k = d * N_k * \text{Cos}(\alpha_k) \quad \text{Eq. (5)}$$

where d is the predetermined nominal pitch distance, $N_k$ is an integer or a rational number associated with conductive line pitches in each polarizer layer k, and $\alpha_k$ is the orientation of the layer. Accordingly, the spatial period A of the unit cells is given by:

$$A = N * d \quad \text{Eq. (6)}$$

where N=Max{$N_k$}

It should be understood that the widths of the $W_k$ of conductive lines, in each layer k, are typically smaller than the spatial-periodicity/pitch $d_k$ of the conductive lines so that the conductive lines are spaced apart from one another. This is in order to reduce the effects of the polarizer layer k on radiation components which are polarized perpendicular to the conductive lines of the layer, while reflecting the radiation components which are polarized parallel to the conductive lines of the layer. To this end, it should be understood that the widths of the $W_k$ of conductive lines may be the same or different in different layers k.

Figure 3:
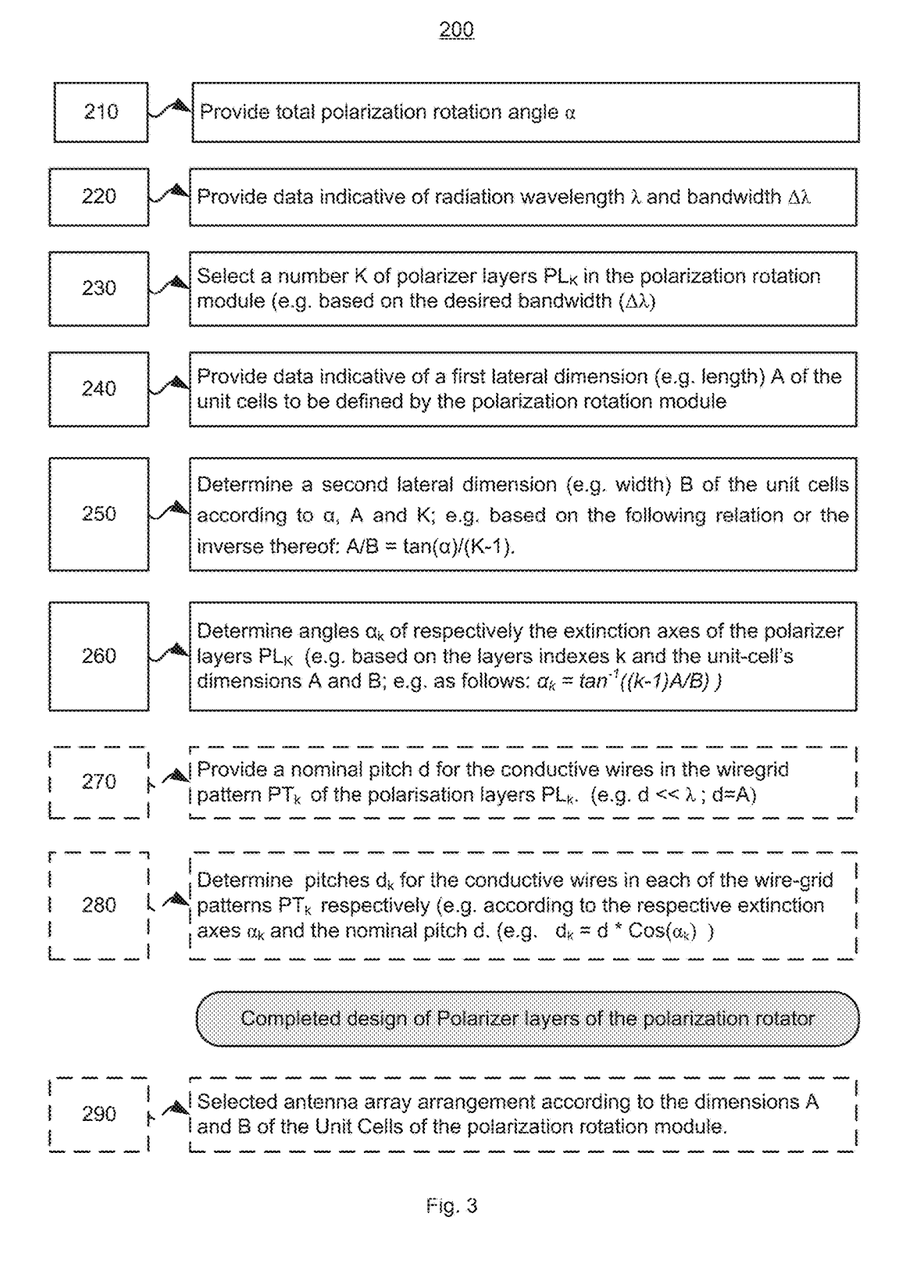
FIG. 3 is a flow chart 200 illustrating a method for designing a polarization filter module 100 according to an embodiment of present invention.

FIG. 3 is a flow chart 200 of a method for designing a polarization filter module 100 (polarization rotator module) according to the present invention. Method 200 includes operations 210 to 290 described forthwith.

Both 210 and 220 show data indicative of a total polarization rotation angle α to be applied to radiation interacting with the polarization filter module 100, and data indicative of the nominal wavelength λ of the radiation and possibly also of the bandwidth Δλ of the radiation wavelength. In operation 230, a desired number K of polarizer layers $PL_k$ to be implemented in the polarization rotation module 100 is provided/determined. The number K may be provided as a predetermined design parameter and/or it may be selected/determined based on the desired bandwidth Δλ and/or based on the desired dimensions/periodicities A and B of the unit cells.

In this connection in operations 240 and 250, the desired lateral dimensions/periodicities A and B of the unit cells' tiling to be defined in the polarization rotation module 100 are determined. For example, in 240 one of these desired periodicities (e.g. the length A or the width B of the unit cells) may be provided, and the other one of these desired periodicities may be determined in 250 by utilizing the ratio A/B which may be calculated based on Eq. (2) and utilizing a and K which are provided in operations 210 and 230 above. Operations 240 and 250 can be performed before or after operation 230.

In 260, the orientation angles $α_k$ of the patterns of the polarizer layers $PL_k$ are determined. For example, the orientation angle $α_k$ of the extinction axis of each polarizer layer $PL_K$ can be determined according to the layer's index k based on Eq. (1) or Eq. (3) above (e.g. utilizing either the desired unit cell dimension ratio A/B or the desired number of layers K as given parameters).

In optional operations 270 and 280 the pitches $d_k$ of the conductive lines/wires in the wire grid patterns $PT_k$ of the respective polarizer layers $PL_k$ are determined. In 270 a nominal pitch is provided/selected, typically in accordance with the radiation wavelength; e.g. d<<λ, and in 280 the pitch $d_k$ of the wires/conductive lines in each layer is selected in accordance with the pattern $α_k$ orientation in each layer k (e.g. according to Eq. 4 or 5 above).

In this regard it should be noted that not only the pitches $d_k$ of different polarizer layers $PL_k$ may have different values, but that accordingly, also the values of the widths $W_k$ of conductive lines may be specifically selected/determined in 280 (e.g. based on the respective pitches $d_k$ of the corresponding layers k) so as to optimize the operation of the polarization rotation module. To this, widths $W_k$ of conductive lines may have the same or different values in different layers k.

In optional operation 290 the arrangement of the receiving and/or transmitting elements of an antenna array is determined in accordance with the dimensions A and B of the unit cells defined. More specifically the spatial periodicities A' and B' of the receiving and/or transmitting elements of the arrays may be selected according to Eq. (7) as integer multiples of the respective spatial periods A and B of the polarization rotation unit cells.

$$A'=m*A \text{ and } B'=n*B \qquad \text{Eq.(7)}$$

where n and m are integer numbers.

To this end, considering Eq. (1) above, given a predetermined desired spatial periodicities A' and B' of the receiving and/or transmitting elements, the orientation angles $α_k$ of the wire-grid patterns $PT_k$ in the stack of the polarization rotation module may be selected as follows:

$$α_k=\tan^{-1}((k-1)(n*A')/(m*B')) \qquad \text{Eq. (8)}$$

This provides that fields of view (e.g. reception/transmission beams of the antennas) of the receiving and/or transmitting antenna elements are exposed to substantially similar wire-grid patterns of the polarization rotator's layers. In other words, the antenna elements are each associated with a certain number of one or more polarization rotator unit cells covering their fields of view (e.g. covering their reception/transmission beams) and located at the same relative positions with respect to the antenna elements associated therewith.

Figure 4A:
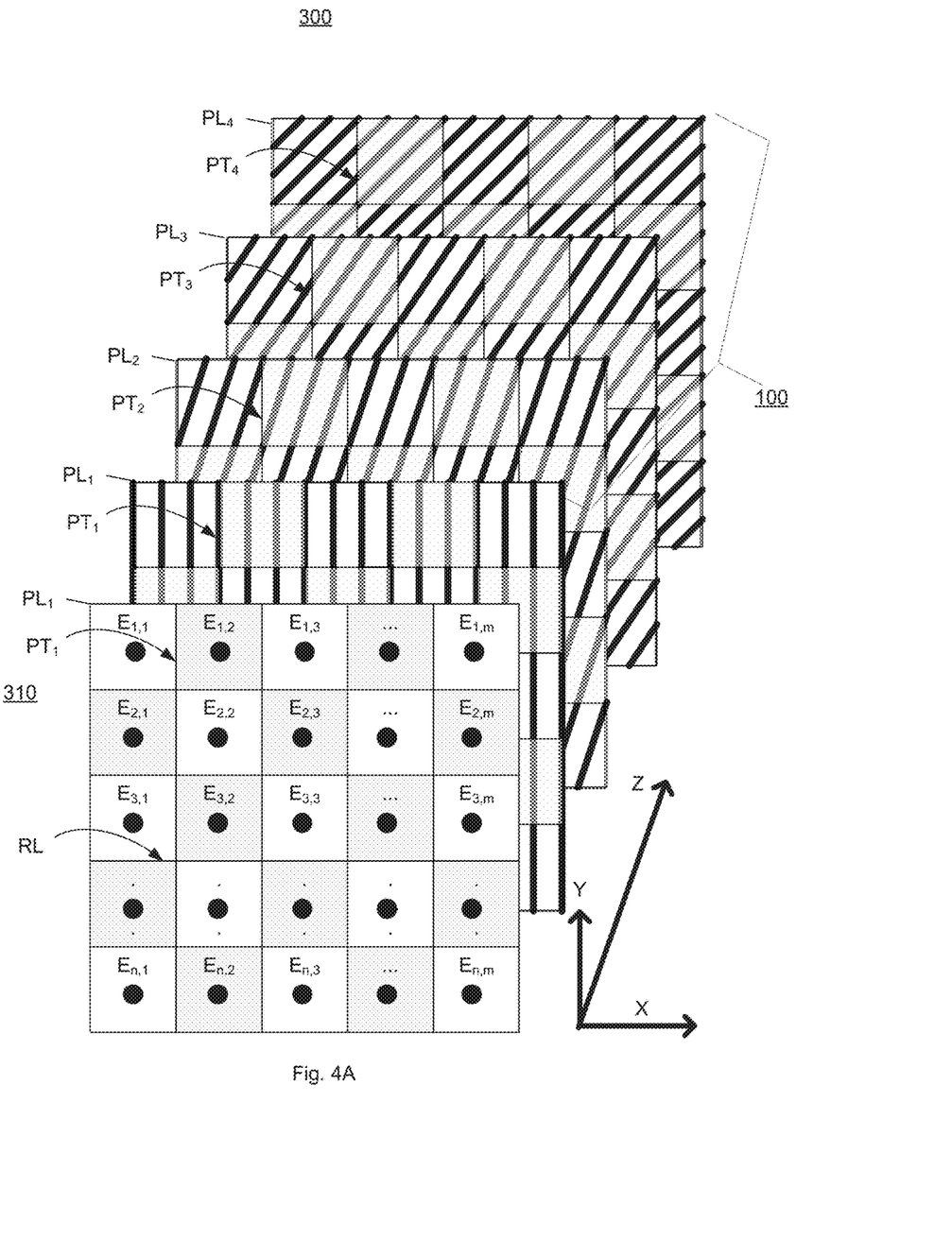
FIGS. 4A and 4B are schematic illustrations of two radiation/antenna modules 300 configured according to two embodiments of the present invention.
Figure 4B:
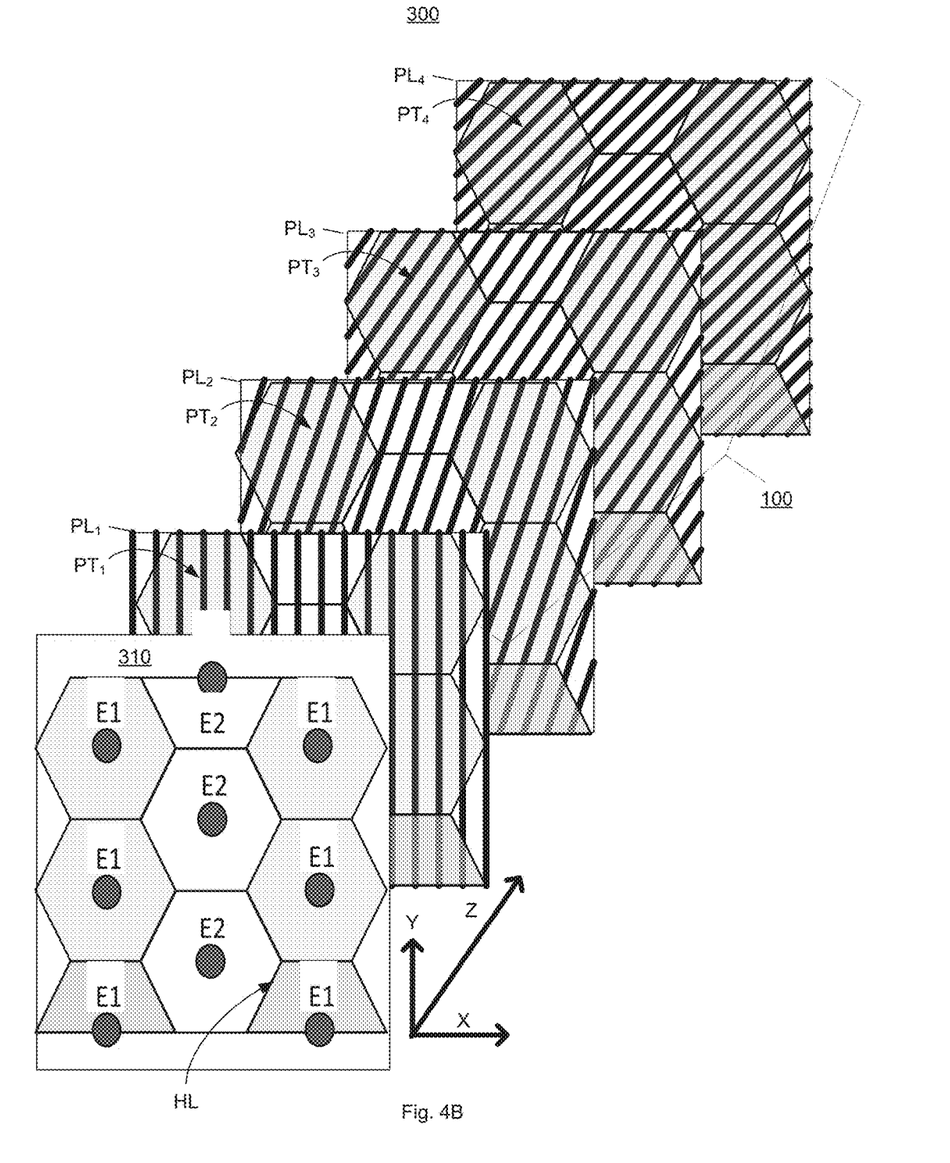

Reference is now made together to FIGS. 4A and 4B illustrating two examples of a radiation/antenna module 300. As shown in these figures, the radiation module 300 includes a polarization rotation module 100 configured according to an embodiment of the present invention, and an arrangement/array 310 of radiating elements. For clarity, the radiating elements are herein after also referred to as antenna elements or just elements, although it should be understood that types of radiation elements may also be used and are also considered in the scope of the present invention. The radiating/antenna elements are arranged/tiled to form different types of a two-dimensional array. The antenna elements of the array 310 are arranged in a plane substantially parallel to the plane of the polarization rotator module 100 (namely parallel to the polarizer layers $PL_k$ thereof). It should be noted, although not expressly depicted in the figure, that according to some embodiments of the present invention the polarization rotator module 100 is configured with a lateral extent greater than a lateral extent of the arrangement of elements along the two lateral axes X and Y such that the field of view (the reception/transmission beam) of each of the antenna elements (e.g. including those elements located at the margins of the array) is entirely covered by the polarization rotator module 100.

FIG. 4A illustrates an antenna module 300 including an array 310 of antenna elements $E_{n,m}$ arranged in a rectangular lattice with spatial periodicities A' and B' along the two lateral axes X and Y, and a polarization rotator module 100 configured according to the present invention and accommodated in front of the array 310 of antenna elements $E_{n,m}$. The number of polarizer layers K of the polarization rotator module 100 and the orientations $α_k$ of their respective extinction axes $EX_k$ were selected according to the present invention, to define in the polarization rotator module 100, a tiling of unit cells arranged with spatial periods A=A'/m and B=B'/n, where n and m are integers. In the present illustration m=3 and n=1. A rectangular lattice RL with periodicities A' and B' along the X and Y axes is illustrated in the figure and its projection onto each of the polarizer layers is also shown. It should be understood that the rectangular lattice RL is not an element of the antenna module 300 but is illustrated in the figure only to serve as a guide to the eye, to illustrate that cells in the lattice "see" similar wire-grid polarizer layer patterns.

FIG. 4B illustrates an antenna module 300 including an array 310 of antenna elements $E_{n,m}$ arranged in a hexagonal lattice with spatial periodicities A' and B', and a polarization rotator module 100 similar to that of FIG. 4A accommodated in front of the array 310. The hexagonal lattice HL is illustrated in the figure together with its projection onto each of the polarizer layers to serve as a guide to the eye. As can be seen in the hexagonal lattice HL there are defined two groups of cells respectively accommodating elements $E^1$ and $E^2$, and the elements in each group of cells lattice "see" similar patterns of the wire-grid polarizer layers. Namely the antenna elements E1 are all exposed to a similar structure of the polarization rotation module 100 in their fields of view, and in the same way the antenna elements E2 are also all exposed to a similar pattern structure of the polarization rotation module 100. To this end, utilizing the hexagonal lattice provides that there are two groups of antenna elements wherein the elements of each group experience a similar optical/electrical effect from the polarization rotation module 100.

In the examples of FIGS. 4A and 4B a rectangular array of antenna elements (FIG. 4A) and a hexagonal array of antenna elements (FIG. 4B) are respectively illustrated in conjunction with the polarization rotator module 100. It will be readily appreciated by those versed in the art that the present invention may also be implemented with different types/geometries of arrays of receiving and/or transmitting elements. For example, the polarization rotator module 100 may be configured for use with one dimensional arrays or with two dimensional arrays of antenna elements. Also, according to various embodiments of the present invention, the polarization rotator module 100 may be used with other array geometries (other lattice types) such as triangular or rhombus arrays of antenna elements. Yet further, according to various embodiments of the present invention, the polarization rotator module 100 may be used with composite arrays of antenna elements formed as two or more superimposed arrays of elements, where the periodicities A' and B' of each of the superimposed arrays each satisfy Eq. (7) above. In this connection, the antenna elements of each of the superimposed arrays may be laterally shifted, or with respect to the other of the superimposed arrays, by a non-integer number of unit cell periods A and B along the lateral X and Y axes respectively. Accordingly, the antenna elements may be considered to belong to different antenna element groups wherein the elements of each group are exposed to similar patterns of the polarization rotation module in their field of view (e.g. each group includes antenna elements of one or more of the superimposed arrays, which are laterally shifted from one another by an integer number of unit cell periods A and B).

It should also be noted that according to some embodiments of the present invention, the polarization rotator module 100 or one or more of its polarizer layers $PL_k$ may be configured as an integrated structure. For example, the polarizer layers $PL_k$ may be formed on a dielectric substrate/layer with a plurality of continuous conductive line regions $CL_k$ printed on the dielectric substrate/layer. According to some embodiments of the present invention, the polarization rotator includes one or more spacer layers arranged in between consecutive polarizer layers $PL_k$ that are formed on the dielectric substrate. For example according to some embodiments of the present invention, the dielectric substrate on which the polarizer layers $PL_k$ are implemented may include ceramic material, and/or glass-reinforced epoxy laminate materials, such as FR-4. The spacer layers located between adjacent polarizer layers $PL_k$ may include structural foam materials such as ROHACELL®. It should be understood that according to some embodiments of the present invention all of the layers of the polarization rotator may be implemented integrally by the integrated structure. Alternatively or additionally, one or more of the polarizer layers, or all of the polarizer layers may be implemented as separate structures and may be fabricated by any suitable technology (e.g. utilizing an integrated structure fabrication technology and/or any other suitable fabrication technology).

In some embodiments, the antenna array 310 may also be configured as an integrated structure, printed on a substrate. To this end the antenna array 310 and the polarization rotation module 100 may be integrated together in a single integrated structure including a stack of printed circuit boards including at least one printed circuit layer with the antenna array printed thereon, and one or more printed circuit boards with one or more of said polarizer layers printed thereon.

The invention claimed is:

1. A polarization rotator, comprising:
a plurality of polarizer layers stacked along a general direction of radiation propagation through said polarization rotator; each of said plurality of polarizer layers implements a respective continuous wired grid pattern defining a respective extinction axis for extinction of components of said radiation that are polarized along the respective extinction axis when interacting with the respective one of the plurality of polarizer layers; each pair of consecutive polarizer layers of said polarization rotator are arranged such that their respective extinction axes have different orientations, thereby affecting polarization rotation of the radiation interacting with said polarization rotator;
wherein the continuous wire-grid patterns of the plurality of polarizer layers are arranged with specific relative orientations of their respective extinction axes adjusted to define a lateral tiling of a plurality of substantially identical polarization rotation unit cells in said polarization rotator with respective spatial periods A and B along two lateral axes spanning said tiling in the polarization rotator.

2. The polarization rotator according to claim 1, further comprising a number of N polarization rotation layers arranged in said stack and configured for rotating the polarization of said radiation by a predetermined angle α; and wherein the number N of polarization rotation layers is selected such that the polarization rotator is operable in a desired operational wavelength bandwidth Δλ.

3. The polarization rotator according to claim 2 wherein a ratio between said predetermined spatial periods, A and B, of the tiling of the substantially identical polarization rotation unit cells along said two lateral axes respectively is given by $A/B = \tan(\alpha)/(N-1)$.

4. The polarization rotator according to claim 2 wherein the plurality of polarizer layers in the stack are configured such that the extinction axes thereof are oriented with orientation angles $\alpha_k = \tan^{-1}((k-1)A/B)$ where k indicates the location of the polarizer layer in the stack.

5. The polarization rotator according to claim 1 wherein continuous wire-grid patterns of the polarizer layers are formed with corresponding respective pitches $d_k$ selected such that said continuous wire-grid patterns are periodic along a certain lateral axis with spatial periodicity $N*d$, where N is an integer number and d is a predetermined value associated with a nominal pitch distance.

6. The polarization rotator according to claim 5 wherein said predetermined respective spatial period A of the unit cells along said certain lateral axis is given by $A = N*d$.

7. The polarization rotator according to claim 5 wherein said respective pitches $d_k$ of the continuous wire-grid patterns of polarizer layers satisfy $d_k = d*N_k*\cos(\alpha_k)$ where $N_k$ is an integer or a rational number associated with each polarizer layer k respectively, and $\alpha_k$ is the orientation of the respective polarizer layer k.

8. The polarization rotator according to claim 7 wherein said respective pitches $d_k$ of the continuous wire-grid patterns of polarizer layers satisfy $d_k=d*Cos(\alpha_k)$.

9. The polarization rotator according to claim 1 wherein the continuous wire-grid pattern of each polarizer layer is formed as an arrangement of a plurality of continuous conductive line regions spaced apart from one another by a distance of less than a nominal wavelength λ of the radiation which is to be polarized and oriented along the extinction axis of the polarizer layer.

10. The polarization rotator according to claim 9 wherein at least some of said polarizer layers comprise a dielectric substrate with said plurality of continuous conductive line regions printed on said dielectric substrate.

11. The polarization rotator according to claim 10, further comprising one or more spacer layers arranged in between at least two of said polarizer layers.

12. The polarization rotator according to claim 11 wherein said dielectric substrate comprises at least one of ceramic or glass-reinforced epoxy laminate materials, said spacer layer comprises structural foam, and the conductive line regions of at least one layer of said polarizer layers are formed utilizing conductive wires arranged in its respective polarizer layer.

13. A radiation module, comprising:
an array of elements being receiving, transmitting, or transceiving elements and a polarization rotator configured according to claim 1;
wherein said array of elements are arranged in a plane substantially parallel to the tiling of the plurality of the polarization rotation unit cells; and
wherein said array of elements are arranged along each of said two lateral axes with respective spatial periodicities A' and B' that are, respectively, integer multiples of the predetermined spatial periods A and B of the polarization rotation unit cells, such that fields of view of said antenna elements are exposed to substantially similar wire-grid patterns of the polarization rotator's layers.

14. The radiation module according to claim 13 being an antenna array and said receiving, transmitting, or transceiving elements are antennas; and wherein each of the receiving, transmitting, or transceiving elements is associated with one or more of said polarization rotator unit cells covering its field of view.

* * * * *